United States Patent [19]

Holt et al.

[11] 4,311,961
[45] Jan. 19, 1982

[54] TESTING OF ENCLOSED ELECTROMAGNETIC RELAYS

[75] Inventors: William D. Holt, Colne; John M. Robinson, Nelson, both of England

[73] Assignee: Lucas Industries Limited, Birmingham, England

[21] Appl. No.: 91,505

[22] Filed: Nov. 5, 1979

[30] Foreign Application Priority Data

Nov. 25, 1978 [GB] United Kingdom ............... 46081/78

[51] Int. Cl.³ ........................................... G01R 31/02
[52] U.S. Cl. ..................................... 324/418; 324/205
[58] Field of Search ............... 324/205, 229, 230, 415, 324/417, 418, 421

[56] References Cited

U.S. PATENT DOCUMENTS 1,296,932  3/1919  Dodge ................................. 324/205

OTHER PUBLICATIONS

A. H. Haller et al., "Testing Relays", Western Electric Tech. Digest, No. 44, Oct. 1976, pp. 25, 26.

*Primary Examiner*—Michael J. Tokar
*Attorney, Agent, or Firm*—Holman & Stern

[57] ABSTRACT

An apparatus for testing enclosed electromagnetic relays includes a probe displaceable into the relay enclosure to engage the movable contact thereof. The probe is associated with a force transducer and a displacement transducer which provide inputs to a circuit including microprocessor unit which operates to detect the probe force required to break contact between the movable contact and the normally closed contact and to detect the position of the probe when such break occurs and when the normally open contact is made and to calculate the contact travel from the position signals it receives. Contact over travel is also measured by applying current to the relay winding and measuring probe displacement required to re-engage the contact.

8 Claims, 3 Drawing Figures

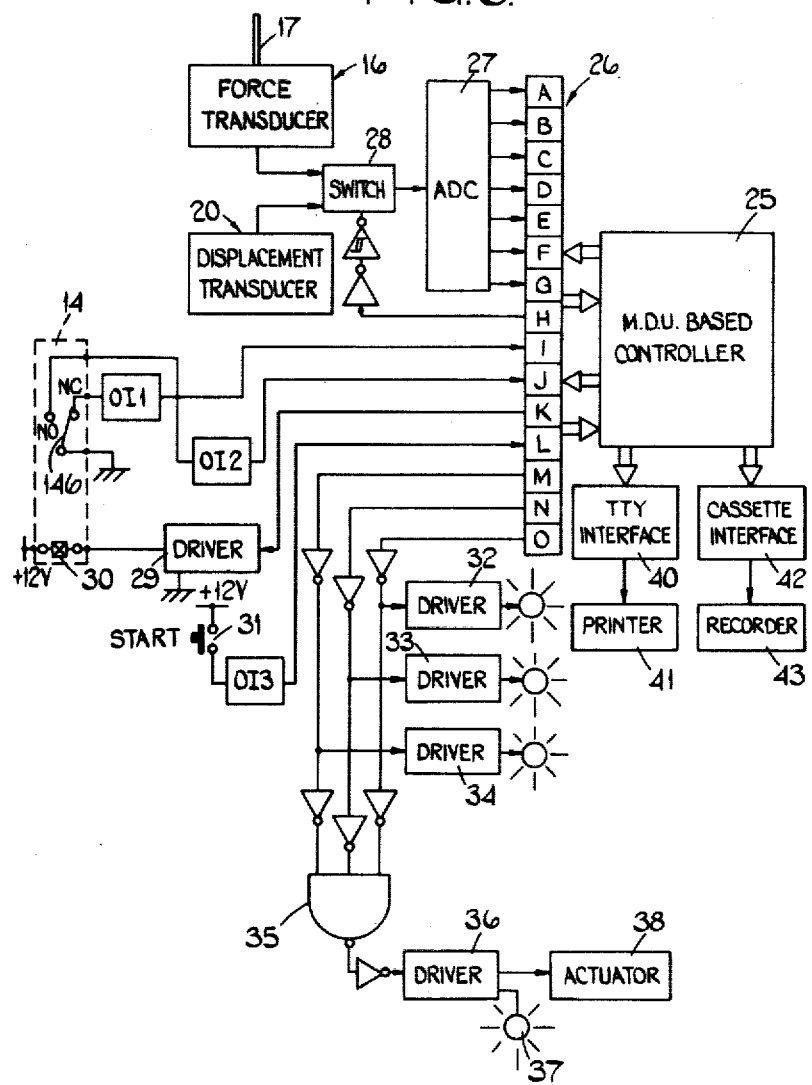

TESTING OF ENCLOSED ELECTROMAGNETIC RELAYS

BRIEF SUMMARY OF THE INVENTION

This invention relates to the testing of enclosed electromagnetic relays.

During the manufacture of enclosed electromagnetic relays, the mechanical processes involved in enclosing the functional parts of the relay in a cover or housing sometimes result in the functional parts of the relays being deformed or damaged. While it is a relatively simple matter to test the proper functioning of a relay before the cover or housing is affixed, such testing is inadequate because of the possibility of the relay ceasing to function correctly when the cover or housing is affixed.

Accordingly it is one object of the present invention to provide a convenient method of testing an enclosed relay after its enclosure is complete.

Basically the invention arises from the appreciation that a relay can be tested by means of a fine probe inserted through an opening in the enclosure, which opening can be subsequently blocked without creating mechanical stresses in the enclosure.

A method in accordance with the invention comprises inserting a measuring probe through an opening in the relay enclosure into engagement with a movable contact of the relay, displacing said probe so as to move the movable contact and measuring the force exerted by the probe to break electrical contact between said movable contact and a first fixed contact of the relay and the distance moved by the probe between such breaking of electrical contact and the making of electrical contact between the movable contact and a second fixed contact of the relay.

Preferably, when the movable contact makes electrical contact with said second fixed contact, the coil of the relay is caused to be energised and the same probe is then displaced further until it again engages the movable contact and this further displacement is measured.

The invention also resides in apparatus for testing enclosed electromagnetic relays comprising means for mounting a relay to be tested, a probe for insertion into an opening in the relay enclosure, means for displacing the probe into engagement with a movable contact of the relay, a displacement transducer sensitive to displacement of the probe, a force transducer sensitive to the force applied to the probe to displace the movable contact, and measuring means connected to said transducers and also connected to fixed contacts of the relay for measuring the force required to break electrical contact between the movable contact and a first one of said fixed contacts and the distance through which the probe is displaced between such breaking of electrical contact and the making of electrical contact between the movable contact and a second one of said fixed contacts.

Preferably means controlled by said making of electrical contact are provided for energising the relay coil and the measuring means is also used to measure the distance through which said probe is moved between initial making of said electrical contact and re-engagement of the probe with the movable contact.

BRIEF DESCRIPTION OF THE SEVERAL VIEWS OF THE DRAWING

An example of the invention is shown in the accompanying drawings in which:

FIG. 3 is a block diagram of the electronic circuit of the apparatus.

Figure 1:
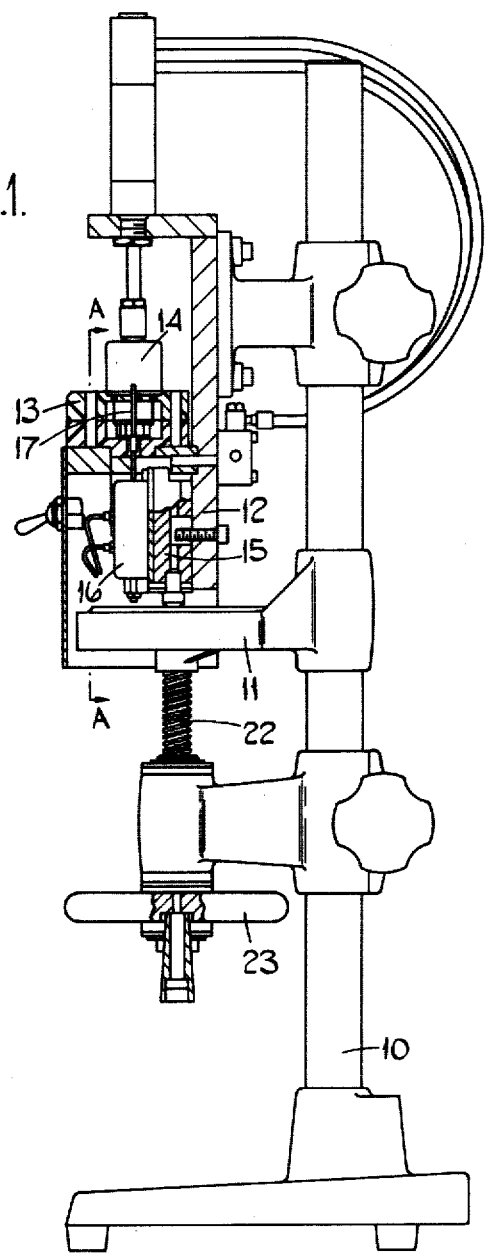
FIG. 1 is a part-sectional elevational view of the apparatus.
Figure 2:
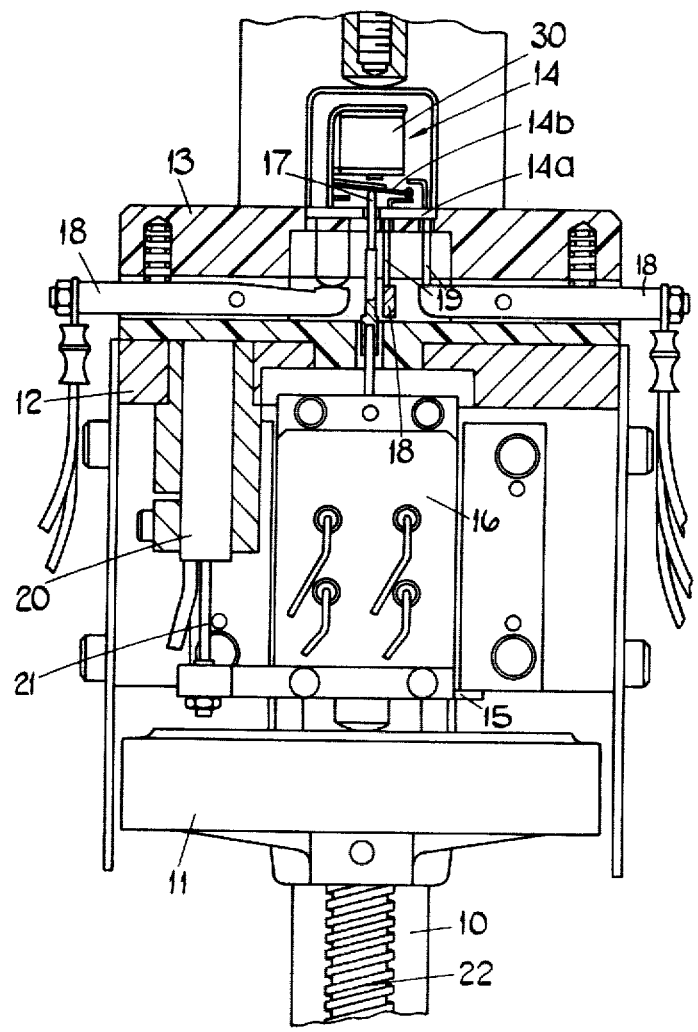
FIG. 2 is an enlarged fragmentary part-sectional view generally taken on line A—A in FIG. 1

Referring firstly to FIGS. 1 and 2 the apparatus shown includes a stand 10 on which a slide member 11 is slidably mounted. A fixedly mounted bracket 12 carries a jig 13 for receiving the relay 14 to be tested. Slidably mounted on the bracket 12 is a carrier 15 on which there is mounted a force transducer 16 having a probe 17. The carrier 15 abuts the slide 11 so that movement of the slide 11 causes the carrier 15 to move relative to the bracket 12. The probe 17 extends through an opening on the base 14a of the relay and into engagement with the movable contact 14b thereof. The jig 13 incorporates spring loaded contact elements 18, which make electrical contact with the terminals 19 on the base of the relay.

The bracket 12 also carries a displacement transducer 20 which has a movable element 21 connected to the carrier 15.

In the example shown the side 11 is movable by means of a screw 22 driven by a handwheel 23, although it will be appreciated that a servo-motor could readily be used instead of a handwheel.

The electrical block diagram of the apparatus shown in FIG. 3 shows a micro-processor based control unit 25 which receives and processes signals from the transducers 16 and 20 and also controls the sequence of operation. A detailed description of the unit 25 is not given herein since a man skilled in the art could readily construct a suitable unit in the light of the information given hereinafter.

Certain of the input-output ports 26A to 26G of the control unit 25 receive a 7-bit digital input from an analog-to-digital converter 27 which serves for both the force transducer 16 and the displacement transducer 20. A switch circuit 28 receives the analog signals from the two transducers and selects which to pass to the converter 27 in accordance with the output of another of the input/output ports 26H. The transducers produce analog signals varying linearly with the force applied to probe 17 and the displacement of carrier 15 respectively, the force transducer being a full bridge inductive transducer and the displacement transducer being a linear variable differential transducer and each including well known circuits for providing a d.c. output.

Two further ports 26I and 26J are connected to receive signals via opto-isolators O.I.1 and 0.I.2 from the normally closed and normal open fixed contacts NC and NO of the relay, the movable contact 14b being earthed. A further port 26K provides a signal to control a drive circuit 29 for energising the relay coil 30. Yet another port 26L receives a START signal from an operator actuated switch 31 via a further opto isolator 0.I.3. Finally there are three ports 26M, 26N and 26O which provide output signals. These signals are routed to three separate lamp driver circuits 32, 33 and 34 and also to a NAND gate 35 controlling a further driver circuit 36 which energises an ACCEPT light 37 and an actuator 38 which determines the route taken by the relay when it is unloaded from the testing aparatus.

When a relay has been loaded into the jig 13, the operator actuates the START switch which puts an input into the unit 25 via port 26L. The unit 25 then causes lamp drivers 32, 33 and 34 to be energised and switch 28 to be put into the state in which the output of displacement transducer 20 is connected to the converter 27. The operator then turns the handwheel 23 to cause the probe to enter into the relay and engage the movable contact 14b. When the contact 14b loses contact with the normally closed contact NC, the signal entering the unit 25 via port 26I causes the output of the converter 27 to be transferred into a data store in the unit 25. A signal at port 26H then causes switch 28 to change-over so that the force analog signal is applied to converter 27 and after a suitable short delay, the output of the converter is transferred into another part of the data store of unit 25. This digital signal is compared in unit 25 with tolerance limits held in the read-only memory of the unit 25 and if it is within these limits an output is produced at port 260 to extinguish lamp 32. If the digital signal is outside the set limits lamp 32 remains lit and the sequence of operations is discontinued.

If the force transducer output is within the set limits, the switch 28 is changed back to the displacement transducer output and, when contact 14b touches contact NO, the output of the converter 27 is again transferred into yet another part of the data store of unit 25. This displacement signal and that stored when the contact NC opened are now processed to produce a digital signal representing the contact gap or free travel and this gap digital signal is stored and compared with limit data drawn from the ROM. If the gap digital signal is outside the set limits the test is stopped so that lamp driver 33 remains energised.

If the gap digital signal is within the set limits driver 33 is de-energised, driver 29 is energised and switch 28 is operated to switch the converter 27 to the force transducer 16. As a result of energisation of the coil 30, the movable contact 14b is caused to overtravel so that the probe 17 ceases to engage it. When the probe has travelled far enough to re-engage the movable contact again this is signalled by a rise in the output of the force transducer and as a result of the increase in the input to unit 25, the switch 28 is switched back to the displacement transducer and another displacement reading is transferred into the memory store of unit 25. This displacement signal and that stored at the time when contact NO closed are now processed to produce an overtravel digital signal which is transferred into the store and is also compared with set limits data drawn from the ROM. If the overtravel digital signal is outside the set limits lamp driver 34 remains energised. If it is within the limits, the lamp driver 34 is de-energised, and driver 36 is energised to light the ACCEPT lamp 37 and also operate the actuator 38 to direct the relay onto a route for accepted relays after it has been unloaded from the test equipment.

The test sequence now being completed, the unit 25 now calls up the contact force digital signal, gap digital signal and overtravel digital signal from its memory store in turn and transmits these via a teleprinter interface circuit 40 to a printer 41 and/or via a cassette interface circuit 42 to a cassette recorder 43. The unit is then ready for a new test cycle to commence.

In the manual apparatus described the operator now rewinds the slide 11 back to its starting point and unloads the test relay.

Where a servo-motor is used to drive the slide 11, this can be controlled by the microprocessor unit to start, step and reverse at the appropriate times in accordance with the signals received from the various contacts, switches and transducers.

It will be appreciated that the test apparatus described above may be incorporated in a larger automatic apparatus in which other tests, e.g. insulation tests, are made on the relays, in which case, the same microprocessor control unit 25 may also control the other tests. The apparatus may also include a mechanism for assembling and crimping the covers of the relays on the bases thereof immediately before testing.

We claim:

1. A method of testing an enclosed electromagnetic relay comprising the steps of inserting a measuring probe through an opening in the relay enclosure into engagement with a movable contact of the relay, displacing said probe so as to move the movable contact and measuring the force exerted by the probe to break electrical contact between said movable contact and a first fixed contact of the relay and the distance moved by the probe between such breaking of electrical contact and the making of electrical contact between the movable contact and a second fixed contact of the relay.

2. A method as claimed in claim 1 including the further steps of causing the coil of the relay to be energised when the movable contact makes electrical contact with said second fixed contact, displacing said probe further until it again engages the movable contact and measuring this further displacement.

3. Apparatus for testing enclosed electromagnetic relays comprising means for mounting a relay to be tested, a probe for insertion into an opening in the relay enclosure, means for displacing the probe into engagement with a movable contact of the relay, a displacement transducer sensitive to displacement of the probe, a force transducer sensitive to the force applied to the probe to displace the movable contact, and measuring means connected to said transducer and also connected to fixed contacts of the relay for measuring the force required to break electrical contact between the movable contact and a first one of said fixed contacts and the distance through which the probe is displaced between such breaking of electrical contact and the making of electrical contact between the movable contact and a second one of said fixed contacts.

4. Apparatus as claimed in claim 3 further comprising means for energising the relay coil when contact is made between the movable contact and the second fixed contact, and said measuring means is also used to measure the distance through which said probe is displaced between making of said contact and re-engagement of the probe with the movable contact.

5. Apparatus as claimed in claim 4 in which detection of the re-engagement of the probe with the movable contact is effected by said force transducer.

6. Apparatus as claimed in claim 3 in which said measuring means includes a micro-processor unit, an analog-to-digital converter connected to provide an input to said micro-processor unit, said first and second contacts of the relay providing two further inputs to the microprocessor unit, and a switch device controlled by the microprocessor unit so as to connect either the displacement transducer or the force transducer to the input of said converter, said microprocessor unit being programmed to carry out the following sequence of operations, (a) connect the displacement transducer to the converter during a first phase of operation;
(b) store the output of the converter when the first contact opens;
(c) connect the force transducer to the converter when operation (b) is completed;
(d) store the output of the converter after a conversion delay
(e) connect the displacement transducer to the converter when operation (d) is completed
(f) store the output of the converter when the second contact closes and
(g) calculate the contact travel by deducting the output stored in operation (b) from the output stored in operation (f).

7. Apparatus as claimed in claim 6 in which the microprocessor unit is programmed to perform the further operations of comparing the output stored in operation (d) and the contact travel calculated in operation (g) with respective stored limit values.

8. Apparatus as claimed in claim 6 further comprising a relay drive circuit controlled by the microprocessor unit and controlling current flow in the relay coil, the microprocessor unit being programmed to carry out the following sequence of further operations, (h) energise the relay coil following operation (g),
(i) connect the force transducer to the converter,
(j) detect when the output of the converter changes as a result of the probe re-contacting the movable contact and then connect the displacement transducer to the converter,
(k) store the output of the converter following a conversion delay, and
(l) calculate the contact over travel by substracting the output stored in operation (f) from the output stored in operation (k).

* * * * *